United States Patent
Kim et al.

(10) Patent No.: US 11,245,820 B2
(45) Date of Patent: Feb. 8, 2022

(54) CAMERA MODULE AND ELECTRONIC DEVICE COMPRISING SAME

(71) Applicant: Samsung Electronics Co., Ltd., Gyeonggi-do (KR)

(72) Inventors: Man-Ho Kim, Gyeonggi-do (KR); Hwa-Joong Jung, Gyeonggi-do (KR); Tae-Yun Kim, Gyeonggi-do (KR); Joong-Wan Park, Gyeonggi-do (KR); Yong-Hwan Choi, Gyeonggi-do (KR); Ki-Huk Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/468,827

(22) PCT Filed: Nov. 28, 2017

(86) PCT No.: PCT/KR2017/013693
§ 371 (c)(1),
(2) Date: Jun. 12, 2019

(87) PCT Pub. No.: WO2018/110862
PCT Pub. Date: Jun. 21, 2018

(65) Prior Publication Data
US 2020/0244856 A1     Jul. 30, 2020

(30) Foreign Application Priority Data

Dec. 13, 2016    (KR) .......................... 10-2016-0169792

(51) Int. Cl.
*H04N 5/225*     (2006.01)
*H04N 5/232*     (2006.01)

(52) U.S. Cl.
CPC ....... *H04N 5/22521* (2018.08); *H04N 5/2253* (2013.01); *H04N 5/2254* (2013.01); *H04N 5/23287* (2013.01)

(58) Field of Classification Search
None
See application file for complete search history.

(56) References Cited

U.S. PATENT DOCUMENTS 8,139,145 B2 * 3/2012 Ryu ..................... H05K 1/0218
                                                           348/373
9,294,661 B2 * 3/2016 Choi ..................... G03B 17/02
(Continued)

FOREIGN PATENT DOCUMENTS

JP        2015-34912 A     2/2015
KR    10-2006-0091906 A    8/2006
(Continued)

*Primary Examiner* — Chikaodili E Anyikire
(74) *Attorney, Agent, or Firm* — Cha & Reiter, LLC

(57) ABSTRACT

A camera module provided in an electronic device according to various embodiments of the present invention may comprise an image sensor that comprises a first area which receives an external light and on which an image is formed and a second area which surrounds the first area; and a shielding member that is disposed on the image sensor, corresponds to the second area, and shields electromagnetic waves which are emitted from the image sensor or emitted from the electronic component of the electronic device and introduced into the image sensor. In addition to this embodiment, various embodiments are possible.

7 Claims, 8 Drawing Sheets

(56) References Cited

U.S. PATENT DOCUMENTS

| | | | |
|---|---|---|---|
| 2006/0181633 A1 | 8/2006 | Seo | |
| 2012/0018830 A1* | 1/2012 | Lin | H01L 27/14618 257/432 |
| 2012/0218450 A1* | 8/2012 | Pavithran | H04N 5/2257 348/296 |
| 2013/0221200 A1* | 8/2013 | Watanabe | G03B 11/00 250/208.1 |
| 2013/0320471 A1* | 12/2013 | Luan | H01L 27/14618 257/432 |
| 2014/0063302 A1* | 3/2014 | Shukla | H04N 5/2257 348/294 |
| 2014/0184881 A1* | 7/2014 | McKinley | H04N 5/23296 348/345 |
| 2014/0267767 A1* | 9/2014 | Choi | H04N 5/2252 348/164 |
| 2015/0015954 A1* | 1/2015 | Baik | G02B 7/08 359/507 |
| 2015/0130990 A1* | 5/2015 | Cho | H04N 5/2257 348/357 |
| 2015/0215501 A1 | 7/2015 | Cho | |
| 2015/0222793 A1* | 8/2015 | Kang | H04N 5/2257 348/373 |
| 2015/0281532 A1* | 10/2015 | Yu | H04N 5/2257 348/373 |
| 2016/0116653 A1* | 4/2016 | Murayama | H01L 27/14618 359/359 |
| 2016/0154154 A1* | 6/2016 | Lee | G02B 5/208 348/342 |
| 2016/0178816 A1* | 6/2016 | Takahashi | C08K 5/00 359/350 |
| 2016/0178923 A1 | 6/2016 | Hayashi | |
| 2018/0151742 A1* | 5/2018 | Kurata | H01L 21/8258 |
| 2018/0191930 A1* | 7/2018 | Jeong | H04N 5/2252 |
| 2019/0258141 A1* | 8/2019 | Park | G03B 19/22 |
| 2020/0296287 A1* | 9/2020 | Min | G02B 7/08 |

FOREIGN PATENT DOCUMENTS

| | | |
|---|---|---|
| KR | 10-2007-0067898 A | 6/2007 |
| KR | 10-2010-0089189 A | 8/2010 |
| KR | 10-2012-0059184 A | 6/2012 |
| KR | 10-2015-0090715 A | 8/2015 |
| KR | 10-1567063 B1 | 11/2015 |
| KR | 10-2016-0040571 A | 4/2016 |

\* cited by examiner

CAMERA MODULE AND ELECTRONIC DEVICE COMPRISING SAME

CROSS-REFERENCE TO RELATED APPLICATION(S)

This application is a National Phase Entry of PCT International Application No. PCT/KR2017/013693, which was filed on Nov. 28, 2017, and claims priority to Korean Patent Application No. 10-2016-0169792, which was filed on Dec. 13, 2016, the contents of which are incorporated herein by reference.

BACKGROUND

1. Field

Various embodiments of the present disclosure relate to a camera module in an electronic device and to, for example, a camera module that prevents electromagnetic interference.

2. Description of the Related Art

An electronic device refers to a device that executes a specific function according to a loaded program, such as a home appliance, an electronic notebook, a portable multimedia player (PDP), a mobile communication terminal, a tablet personal computer (PC), a video/audio player, a desktop/laptop computer, an in-vehicle navigator, and so on. For example, these electronic devices may output stored information visually or audibly. Along with an increase in the integration level of electronic devices and the increasing popularity of ultra-high speed, large-capacity wireless communication, a single mobile communication terminal has recently been equipped with various functions. For example, functions such as a communication function, an entertainment function for gaming, a multimedia function for music/video play, a communication and security function for mobile banking or the like, a scheduling function, and an electronic wallet may be integrated in one electronic device.

An electronic device may be equipped with a camera module. As a camera module is mounted in a portable electronic device, research on miniaturization and performance improvement of cameras is under way. Techniques of improving the performance of a camera module include, for example, automatic focus control. With the automatic focus control function, a clear image may be obtained on an imaging surface of an image sensor by moving a lens located in front of the image sensor or the image sensor along an optical axis direction according to a distance to an object. Further, the techniques of improving the performance of a camera module include hand tremor cancellation. The hand tremor cancellation technique compensates for shaking of an object image caused by vibrations of a human body such as hand tremor of a user. The hand tremor cancellation is accomplished, for example, by detecting vibrations exerted on an electronic device such as a camera through a plurality of gyro sensors mounted in the electronic device, and moving a lens or an image sensor according to the angular speed and direction of the detected vibrations.

SUMMARY

As a camera module becomes smaller, electronic parts that execute various functions may be densely arranged. The electronic parts of the camera module generate electromagnetic waves, which may obstruct normal operations of the electronic parts. For example, electromagnetic waves emitted from an image sensor may affect an electronic part (e.g., an actuator) that executes the automatic focus control function or the hand tremor cancellation function. On the contrary, electromagnetic waves emitted from the electronic part that executes the automatic focus control function or the hand tremor cancellation function may affect the image sensor, hampering normal image acquisition.

Various embodiments of the present disclosure are intended to provide a camera module that shields electromagnetic waves emitted from an image sensor or introduced to the image sensor, and an electronic device including the camera module.

Technical Solution

According to various embodiments of the present disclosure, a camera module in an electronic device may include an image sensor including a first area receiving external light and forming an image, and a second area surrounding the first area, and a shielding member disposed on the image sensor, corresponding to the second area, configured to shield electromagnetic waves emitted from the image sensor or an electronic part of the electronic device from being introduced to the image sensor.

According to various embodiments of the present disclosure, an electronic device with a camera module may include a housing of an electronic device and a camera module provided in the housing. The camera module may include an image sensor including a first area receiving external light and forming an image, and a second area surrounding the first area, and a shielding member disposed on the image sensor, corresponding to the second area, configured to shield electromagnetic waves emitted from the image sensor or electromagnetic waves emitted from an electronic part of the electronic device and introduced to the image sensor.

According to various embodiments of the present disclosure, a camera module may include an image sensor including a first area receiving external light and forming an image, and a second area surrounding the first area, a shielding member disposed on the image sensor corresponding to the second area, and a transparent shielding film covering at least the first area.

According to various embodiments of the present disclosure, a method of fabricating a camera module may include mounting an image sensor on a board, mounting a support member on the board, while surrounding the image sensor, disposing an infrared filter on the image sensor, while coupling the infrared filter to a grounding part of the support member, and attaching a shielding member in a masking area of the infrared filter.

According to various embodiments of the present disclosure, a camera module in an electronic device may include a board, an image sensor mounted on the board, a case mounted on the board, and accommodating a lens module, a plurality of coils provided in the case, and a shielding member disposed between the plurality of coils and the image sensor configured to shield electromagnetic waves emitted from the plurality of coils from being introduced to the image sensor or shield electromagnetic waves emitted from the image sensor from being introduced to the plurality of coils.

According to various embodiments of the present disclosure, as a camera module is provided with a shielding member disposed in a second area of an image sensor, electromagnetic waves emitted from the second area or introduced to the second area may be shielded. For example, since the shielding member shields electromagnetic waves introduced to the second area of the image sensor, the quality of an image obtained from the image sensor may be improved.

According to various embodiments of the present disclosure, since the shielding member shields electromagnetic waves emitted from the image sensor, the degradation of the performance of an electronic part (e.g., an auto-focusing actuator or an hand tremor cancelling actuator) caused by the electromagnetic waves may be prevented.

DETAILED DESCRIPTION

Figure 1:
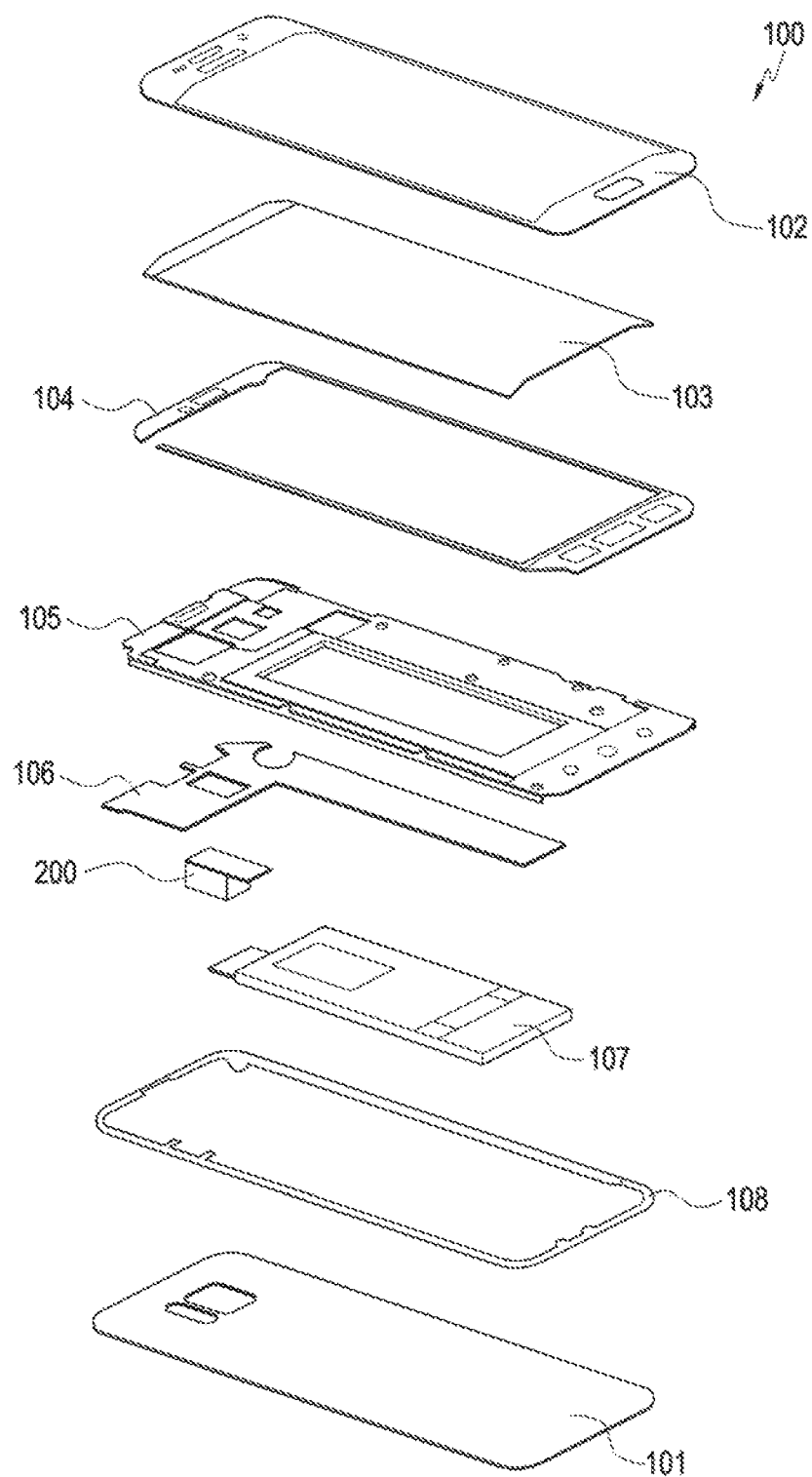
FIG. 1 is an exploded perspective view illustrating an electronic device according to one of various embodiments of the present disclosure.

Reference will be made to various embodiments of the disclosure with reference to the attached drawings. It should be appreciated that the embodiments and the terms used therein are not intended to limit the technological features set forth herein to particular embodiments and include various changes, equivalents, and/or replacements for a corresponding embodiment. With regard to the description of the drawings, similar reference numerals may be used to refer to similar elements. It is to be understood that a singular form of a noun corresponding to an item may include one or more of the things, unless the relevant context clearly indicates otherwise. As used herein, each of such phrases as "A or B" or "at least one of A and/or B" may include all possible combinations of the items enumerated together in a corresponding one of the phrases. As used herein, such terms as "1st" and "2nd" or "first" and "second" may be used to simply distinguish a corresponding component from another, and does not limit the components in importance or order. It is to be understood that if an element (e.g., a first element) is referred to as "(operatively or communicatively) coupled with" or "coupled to" another element (e.g., a second element), it means that the element may be coupled with the other element directly or via a third element.

The term "configured to" as used herein may be interchangeably used with, for example, the term "suitable for", "having the capacity to", "adapted to", "made to", "capable of", or "designed to" in hardware or software under circumstances. Under some circumstances, the term "a device configured to" may mean that the device may be "capable of" with another device or part. For example, "a processor designed (or configured) to execute A, B, and C" may mean a dedicated processor (e.g., an embedded processor) for performing the corresponding operations or a generic-purpose processor (e.g., a central processing unit (CPU) or an application processor) for performing the operations by executing one or more software programs stored in a memory device An electronic device according to various embodiments of the disclosure may include at least one of, for example, a smartphone, a tablet personal computer (PC), a mobile phone, a video phone, an e-book reader, a desktop PC, a laptop PC, a netbook computer, a workstation, a server, a personal digital assistant (PDA), a portable multimedia player (PMP), an MPP3 player, mobile medical equipment, a camera, or a wearable device. The wearable device may include at least one of an accessory type (e.g., a watch, a ring, a bracelet, an ankle bracelet, a necklace, glasses, contact lenses, or a head-mounted device (HMD)), a fabric or clothes type (e.g., electronic clothes), a body-attached type (e.g., a skin pad or tattoo), or an implantable circuit. According to some embodiments, an electronic device may include at least one of, for example, a television, a digital versatile disk (DVD) player, an audio player, a refrigerator, an air conditioner, a vacuum cleaner, an oven, a microwave oven, a washer, an air purifier, a set-top box, a home automation control panel, a security control panel, a media box (e.g., Samsung HomeSync™, Apple TV™, or Google TV™), a game console (e.g., Xbox™ or PlayStation™), an electronic dictionary, an electronic key, a camcorder, or an electronic picture frame.

According to other embodiments, an electronic device may include at least one of a medical device (e.g., a portable medical meter (a blood glucose meter, a heart rate meter, a blood pressure meter, a body temperature meter, or the like), a magnetic resonance angiography (MRA) device, a magnetic resonance imaging (MRI) device, a computed tomography (CT) device, an imaging device, an ultrasonic device, or the like), a navigation device, a global navigation satellite system (GNSS), an event data recorder (EDR), a flight data recorder (FDR), an automotive infotainment device, a naval electronic device (e.g., a naval navigation device, a gyrocompass, or the like), an avionic electronic device, a security device, an in-vehicle head unit, an industrial or consumer robot, a drone, an automatic teller's machine (ATM) in a financial facility, a point of sales (POS) device in a shop, or an Internet of things device (e.g., a lighting bulb, various sensors, a sprinkler, a fire alarm, a thermostat, a street lamp, a toaster, sports goods, a hot water tank, a heater, a boiler, or the like). According to some embodiments, an electronic device may include at least one of furniture, part of a building/structure or a vehicle, an electronic board, an electronic signature receiving device, a projector, or various measuring devices (e.g., a water, electricity, gas or electromagnetic wave measuring device). According to various embodiments, an electronic device may be flexible, or may be one or a combination of two or more of the foregoing devices. An electronic device according to an embodiment of the disclosure is not limited to the foregoing devices. In the disclosure, the term user may refer to a person or device (e.g., artificial intelligence electronic device) that uses an electronic device.

FIG. 1 is an exploded perspective view illustrating an electronic device according to one of various embodiments of the present disclosure.

Referring to FIG. 1, an electronic device 100 according to one of various embodiments of the present disclosure may include a housing 105, a front cover 102, a display module 103, a circuit board 106, a camera module 200, and a rear cover 101.

The housing 105, which forms the body of the electronic device 100, may support, for example, at least one circuit board 106. The housing 105 may be formed at least partially of a conductive material, and at least a part of the conductive-material part of the housing 105 may be used as an antenna device, for example, a radiation conductor. For example, the part of the housing 105 may be insulated from the other part of the housing 105, and may be used as an antenna device, electrically coupled to a communication module.

A battery space may be defined in the housing 105, for accommodating the battery 107 therein. The battery 107 may be accommodated in the battery space, and disposed in parallel to the circuit board 106 without overlap. The battery 107 may be electrically coupled to the circuit board 106.

The display module 103 may be supported by the housing 105. The display module 103 may be disposed opposing the circuit board, with the housing 105 in between. If the housing 105 is formed of a conductive material, electromagnetic waves generated due to an operation of the display 103 may be shielded by the housing 105 formed of the conductive material, thus not being introduced to the circuit board 106, and electromagnetic waves generated due to an operation of the circuit board 106 may be shielded by the housing 105 formed of the conductive material, thus not being introduced to the display 103.

The front cover 102 may be attached onto one surface of the display module 103. The front cover 102 may be formed of glass or transparent reinforced resin. According to various embodiments of the disclosure, the front cover 102 may be formed of any of various transparent, strong materials, not limited to glass or reinforced resin. The front cover 102 may render an image output from the display module 103.

The camera module 200 may be fixed to the housing 105, and electrically coupled to the circuit board 106. A detailed description will be given later of the camera module 200.

The rear cover 101 may be mounted on the rear surface of the housing 105, surrounding the circuit board 106 and the battery 107, and may form the exterior of the electronic device 100 along with at least a part of the housing 101 and the front cover 102. According to various embodiments of the disclosure, the rear cover 101 may be detachably coupled with the housing 105. With the rear cover 101 separated; a user may replace a storage medium (e.g., a subscriber identification module (SIM) card or a secure digital (SD) card) or the battery 107. According to various embodiments of the disclosure, the rear cover 101 and the housing 105 may be incorporated into one body, thus restricting the user's removal of the rear cover 101 from the housing 105.

The electronic device 100 according to various embodiments of the disclosure may further include a first waterproof member 104 and a second waterproof member 108. The first waterproof member 104 may be disposed between the front cover 102 and the housing 105, and seal between the front cover 102 and the housing 105. For example, the first waterproof member 104 may prevent introduction of a foreign material (e.g., water) into the housing 105 through between the front cover 102 and the housing 105. The second waterproof member 108 may be disposed between the rear cover 101 and the housing 105, and seal between the rear cover 101 and the housing 105. For example, the second waterproof member 108 may prevent introduction of a foreign material (e.g., water) into the housing 105 through between the rear cover 101 and the housing 105

Figure 2:
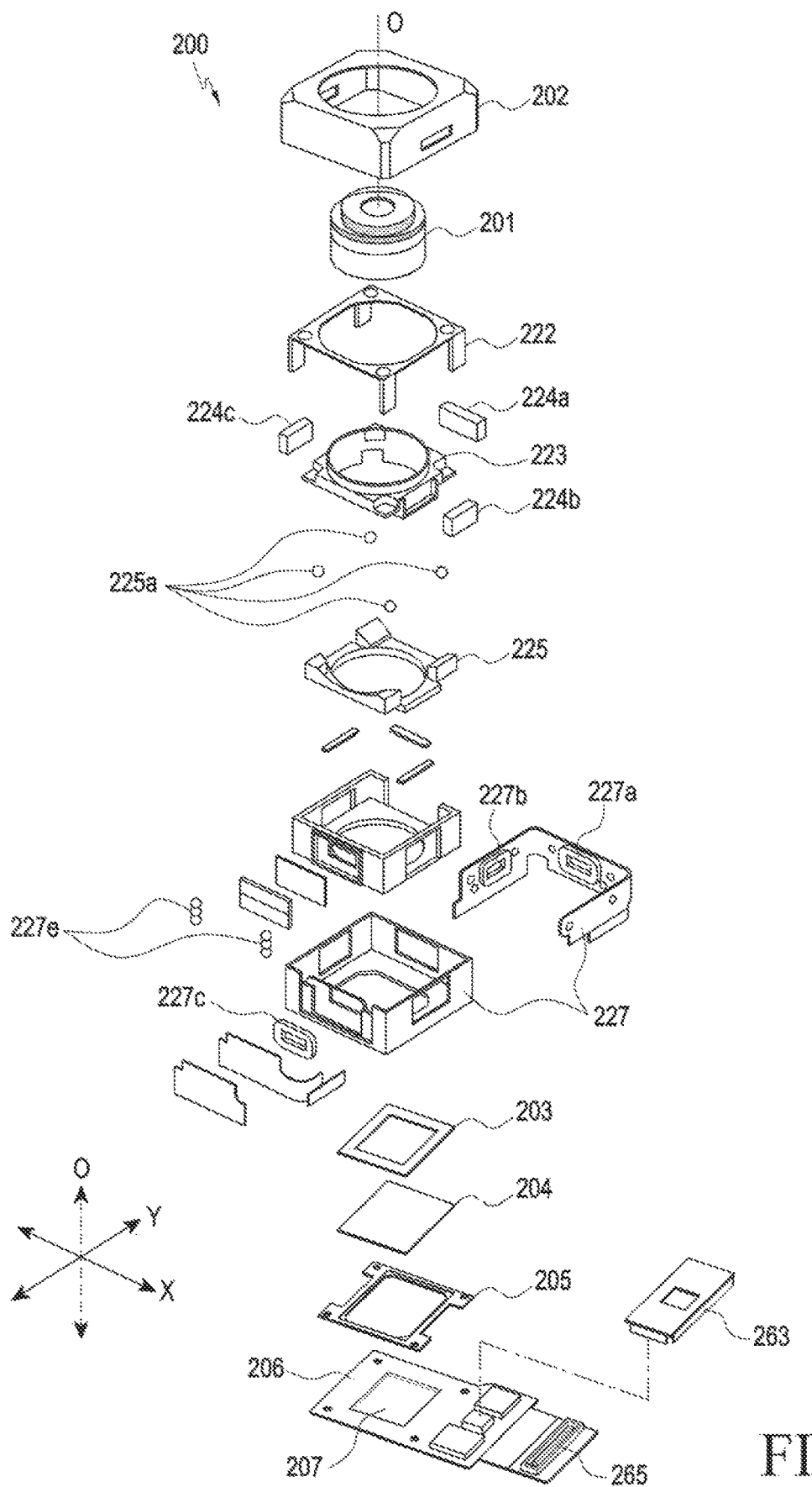
FIG. 2 is an exploded perspective view illustrating a camera module in an electronic device according to one of various embodiments of the present disclosure.
Figure 3:
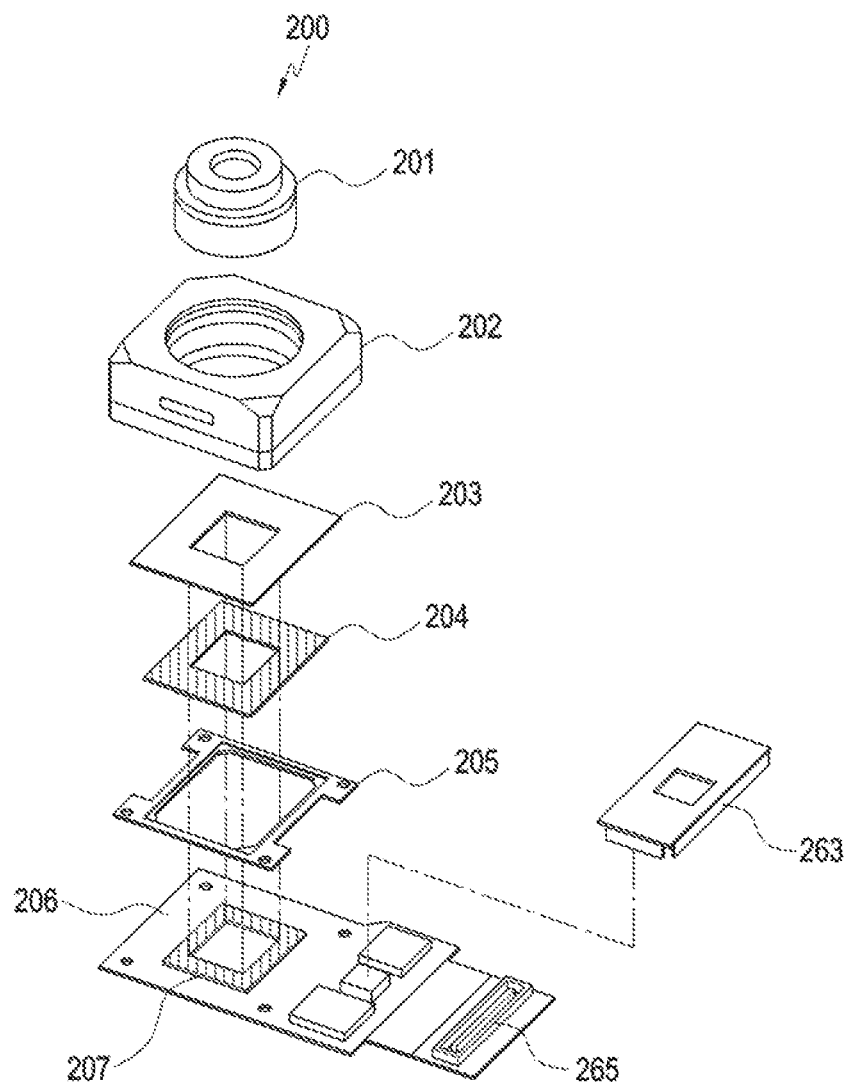
FIG. 3 is an exploded perspective view illustrating a part of a camera module according to one of various embodiments of the present disclosure.

FIG. 2 is an exploded perspective view illustrating a camera module in an electronic device according to one of various embodiments of the present disclosure. FIG. 3 is an exploded perspective view illustrating a part of a camera module in an electronic device according to one of various embodiments of the present disclosure.

Referring to FIGS. 2 and 3, the camera module 200 in an electronic device (100 in FIG. 1) according to one of various embodiments of the present disclosure may include a lens module 201, a case 202, a support member 205, a board 206, an image sensor 207, an infrared filter 204, and a shielding member 203.

The lens module 201 may include a plurality of lenses.

The case 202 may be provided with a carrier 223 and a driver 227.

The carrier 222 may accommodate the lens module 201, and move together with the lens module 201. The carrier 222 may include a plurality of magnetic bodies 224a, 224b, and 224c.

The driver 227 may accommodate the carrier 222 and move the carrier 222. For example, the driver 227 may be an auto-focusing actuator or a hand tremor-cancelling actuator. The driver 227 may be electrically coupled to the board 206. The driver 227 may execute auto-focusing or hand tremor cancellation by moving the lens module 201 accommodated in the case 202.

The driver 227 may include a plurality of coils 227a, 227b, and 227c. The plurality of coils 227a, 227b, and 227c may generate attractive/repulse force to the plurality of magnetic bodies 224a, 224b, and 224c of the carrier 222 according to a received voltage, thereby executing the auto-focusing control function of the camera module, while advancing and retracting the lens module 201 accommodated in the carrier 222 along the direction of an optical axis O. The driver 227 may execute the hand tremor cancellation function of the camera module by moving the carrier 223 in a direction perpendicular to the optical axis O and also on the X-Y plane. For example, a first bearing 225a may make a rolling motion so that the carrier 223 may move on the X-Y plane. A second bearing 227e may make a rolling motion so that the carrier 223 may move along the direction of the optical axis O.

The case 202 is provided with a stopper 222. The stopper 222 may prevent the lens module 201 from slipping off from the case 202 along the direction of the optical axis O. The case 202 is provided with a guide unit 225. The guide unit 225 may be disposed between the carrier 223 and the driver 227, and may guide and support movement of the carrier 223.

The case 202 may be formed of a conductive material, and thus prevent electromagnetic waves generated from the plurality of coils 227a, 227b, and 227c from being emitted to the outside of the case 202.

The support member 205 may be mounted on the board 207, coupled with the inner surface of the case 202. The support member 205 may be formed of resin. According to various embodiments of the disclosure, the support member 205 may be formed of a conductive material such as metal, not limited to resin.

Electronic parts required to operate the camera module may be mounted on the board 206. For example, the electronic parts may be a driving controller that drives the driver 227, and a memory. The electronic parts mounted on the board 206 may be surrounded by a shield can 263. The shield can 263 may be formed of a metal, thus shielding electromagnetic waves emitted from the electronic parts. The board 206 may be provided with a terminal 265 to which the board (106 in FIG. 1) may be electrically coupled through a connector terminal. According to various embodiments of the disclosure, the board 206 may be configured as a part of the circuit board (106 in FIG. 1).

The image sensor 207 may be mounted on the board 206.

The support member 205 may be mounted on the board 206, forming a closed loop along the periphery of the image sensor 207.

The infrared filter 204 may be accommodated in the support member 205. The infrared filter 204 may be disposed between the lens module 201 and the image sensor 207. The infrared filter 204 may be formed of glass or resin. According to various embodiments of the disclosure, the infrared filter 204 may take the form of a film. The infrared filter 204 may be an infrared blocking filter that blocks infrared rays. According to various embodiments of the disclosure, the infrared filter 204 may be an infrared pass filter that passes only infrared rays, not limited to an infrared blocking filter. For example, the infrared pass filter may be used for recognizing an iris of a user.

The shielding member 203 may be attached onto one surface of the infrared filter 204. The shielding member 203 may be formed of a conductive material. For example, the shielding member 203 may be formed of a metal or alloy such as copper, copper alloy, silver, or silver alloy. According to various embodiments of the disclosure, the shielding member 203 may be formed of any of various conductive materials such as conductive resin, not limited to a metal or alloy.

Figure 4:
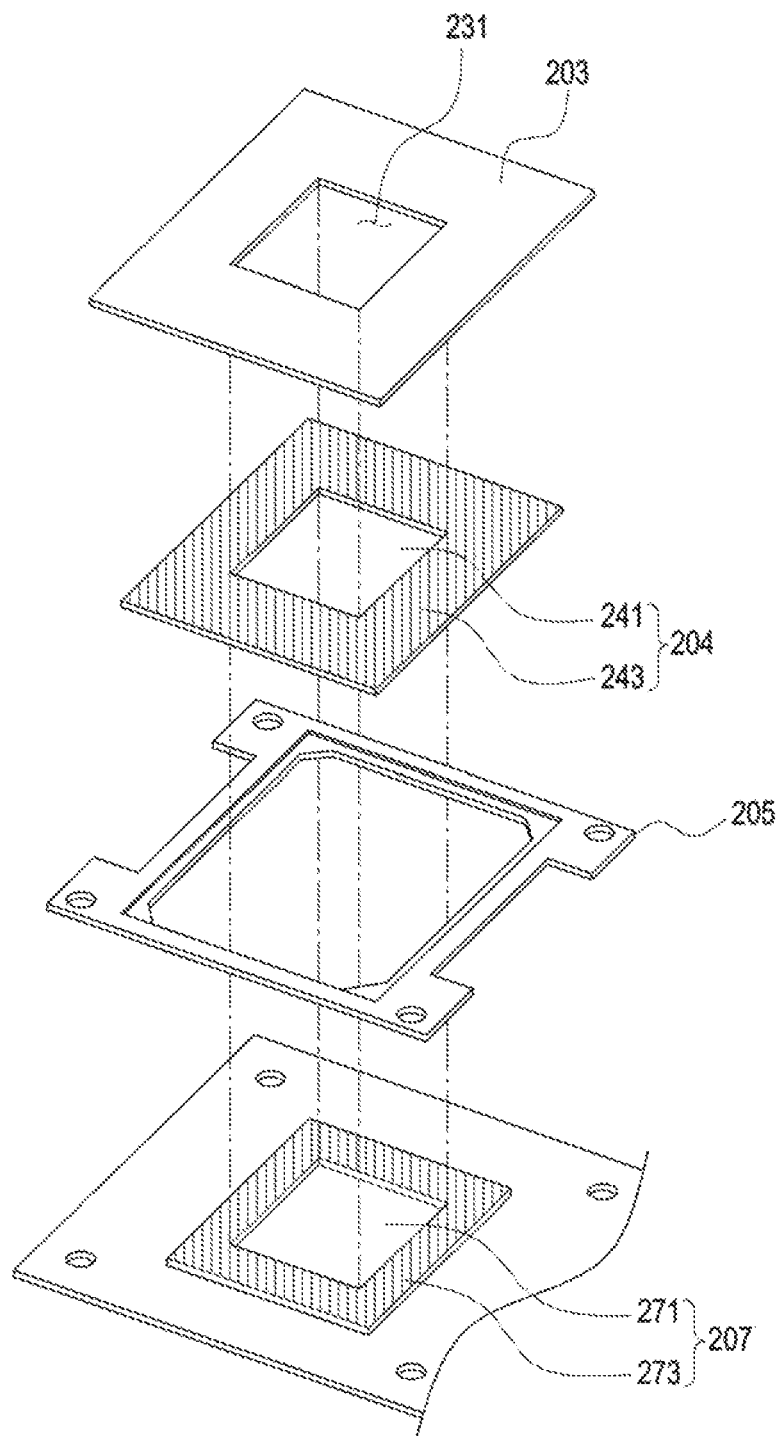
FIG. 4 is an exploded perspective view illustrating a shielding member, an infrared filter, and an image sensor in a camera module according to one of various embodiments of the present disclosure.

FIG. 4 is an exploded perspective view illustrating a shielding member, an infrared filter, and an image sensor in a camera module according to one of various embodiments of the present disclosure.

Referring to FIG. 4, the image sensor 207 may include a first area 271 and a second area 273.

The first area 271 may include a plurality of pixels, and the plurality of pixels may convert incident light to an electrical signal. For example, the first area 271 may receive external light and form an image.

The second area 273 may be disposed to surround the first area 271. The second area 273 may include a driving circuit electrically coupled to the plurality of pixels, for driving the plurality of pixels, a converter for converting an analog signal to a digital signal, and an image sensor processor for forming a digital signal into an image signal.

The infrared filter 204 may include a light pass area 241 corresponding to the first area 271 and a masking area 243 covering the second area 273.

The shielding member 203 may include an opening 231, and may be located in the masking area 243 of the infrared filter 204. The opening 231 of the shielding member 203 may correspond to the first area 271 or the light pass area 241 of the infrared filter 204.

Figure 5:
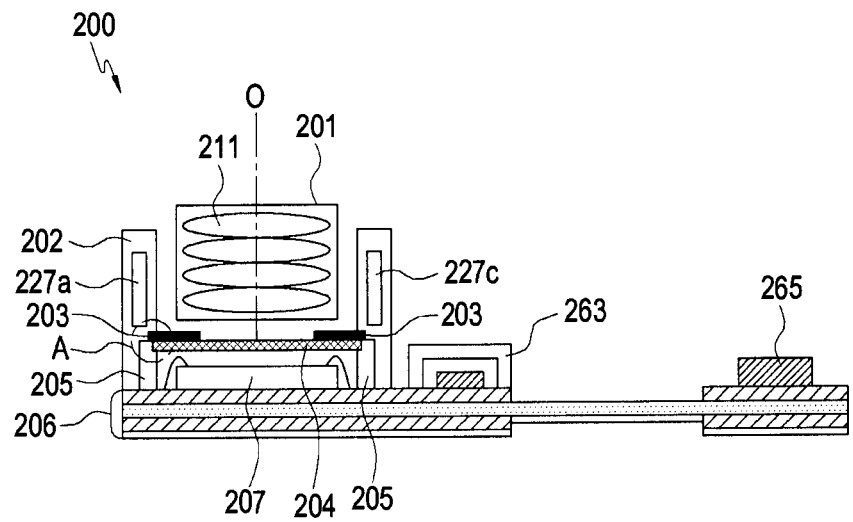
FIG. 5 is a sectional view illustrating a camera module according to one of various embodiments of the present disclosure.
Figure 6:
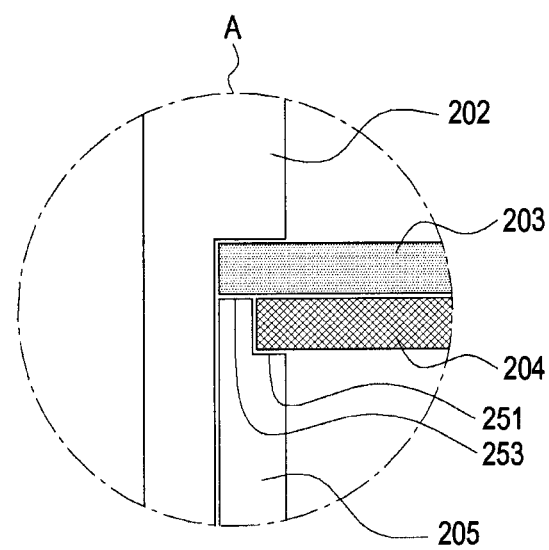
FIG. 6 is an enlarged view of part A illustrated in FIG. 5.
Figure 7:
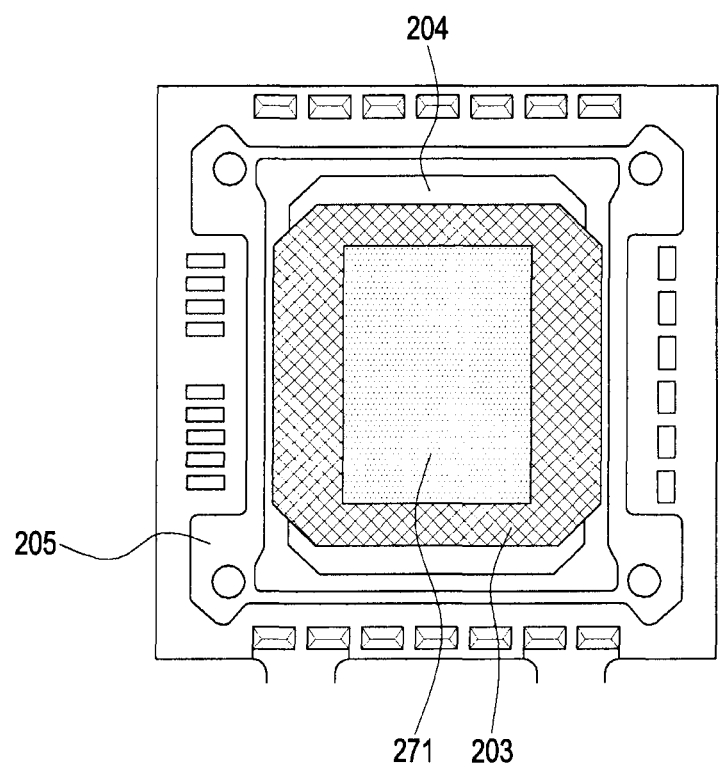
FIG. 7 is a front view illustrating arrangement of a shielding member and an infrared filter in a camera module according to one of various embodiments of the present disclosure.

FIG. 5 is a sectional view illustrating a camera module according to one of various embodiments of the present disclosure. FIG. 6 is an enlarged view of part A illustrated in FIG. 5. FIG. 7 is a front view illustrating arrangement of a shielding member and an infrared filter in a camera module according to one of various embodiments of the present disclosure.

Referring to FIGS. 5 to 7, the camera module 200 according to one of various embodiments of the present disclosure may include the lens module 201, the case 202 that accommodates the lens module 201 and includes a plurality of coils 277a and 277c, the support member 205 coupled with the case 202, the board 206 on which the support member 205 and the image sensor 207 are mounted, the infrared filter 204, and the shielding member 203.

A conductive member 265 may be provided on the bottom surface of the board 206. The conductive member 265 may be formed of a metal. For example, the conductive member 265 may take the form of a metal plate or a metal film. The conductive member 265 may shield electromagnetic waves emitted from the board 206 or electromagnetic waves introduced to the board 206. According to various embodiments of the disclosure, the conductive member 265 may be used as a ground of the circuit board.

The infrared filter 204 may be disposed between the lens module 201 and the image sensor 207.

The support member 205 may be electrically grounded with the infrared filter 204, accommodating the infrared filter 204. The support member 205 may surround the periphery of the image sensor 207, apart from the periphery of the image sensor 207 by a predetermined distance. The support member 205 may be formed of a conductive material. For example, the support member 205 may be formed of a metal. The support member 205 may include a first ground surface 251 contacting the infrared filter 204 and a second ground surface 253 contacting the shielding member 204. The infrared filter 204 may be electrically grounded with the support member 205, attached to the first ground surface 251. The shielding member 204 may be attached onto the second ground surface 253, and electrically grounded with the support member 205. The first and second ground surfaces 251 and 253 may be coated with conductive adhesives, and thus attach the support member 205 and the infrared filter 204 or the support member 205 and the shielding member 203 with each other. The conductive adhesives may be conductive epoxy. According to various embodiments of the present disclosure, the support member 205 and the infrared filter 204 or the support member 205 and the shielding member 203 may be attached onto the first and second ground surfaces 251 and 253 by means of conductive double-sided tapes. The support member 205 may electrically ground the infrared filter 204 and the board 206, thereby effectively blocking infrared rays.

The shielding member 203 may be attached onto one surface of the infrared filter 204. Since the shielding member 203 is electrically grounded with the board 206 through the support member 205, electromagnetic waves may be effectively shielded. As the shielding member 203 is disposed between the image sensor 207 and the plurality of coils 277a and 277c, the shielding member 203 may shield electromagnetic waves emitted from the image sensor 207 from being introduced to the plurality of coils 277a and 277c, and shield electromagnetic waves emitted from the plurality of coils 277a and 277c from being introduced to the image sensor 207. A driver (227 in FIG. 2) including the plurality of coils 277a and 277c may be controlled in pulse width modulation (PWM). Although the driver (227 in FIG. 2) driven in the PWM control method emits a large amount of electromagnetic waves, the driver (227 in FIG. 2) may be controlled in the PWM control method because the shielding member 203 shields electromagnetic waves introduced to the image sensor 207. If the driver (227 in FIG. 2) is an auto-focusing actuator, PWM may reduce a driving current by about 50% (e.g., 20 mA), compared to other methods. If the driver (227 in FIG. 2) is a hand tremor-cancelling actuator, PWM may reduce a driving current by about 20 mA, compared to other methods.

Since the shielding member 203, the support member 205, and the conductive member 265 surround the image sensor 207, electromagnetic waves introduced to the image sensor 207 or electromagnetic waves emitted from the image sensor 207, except for electromagnetic waves introduced to the first area of the image sensor 207 may be shielded.

Figure 8:
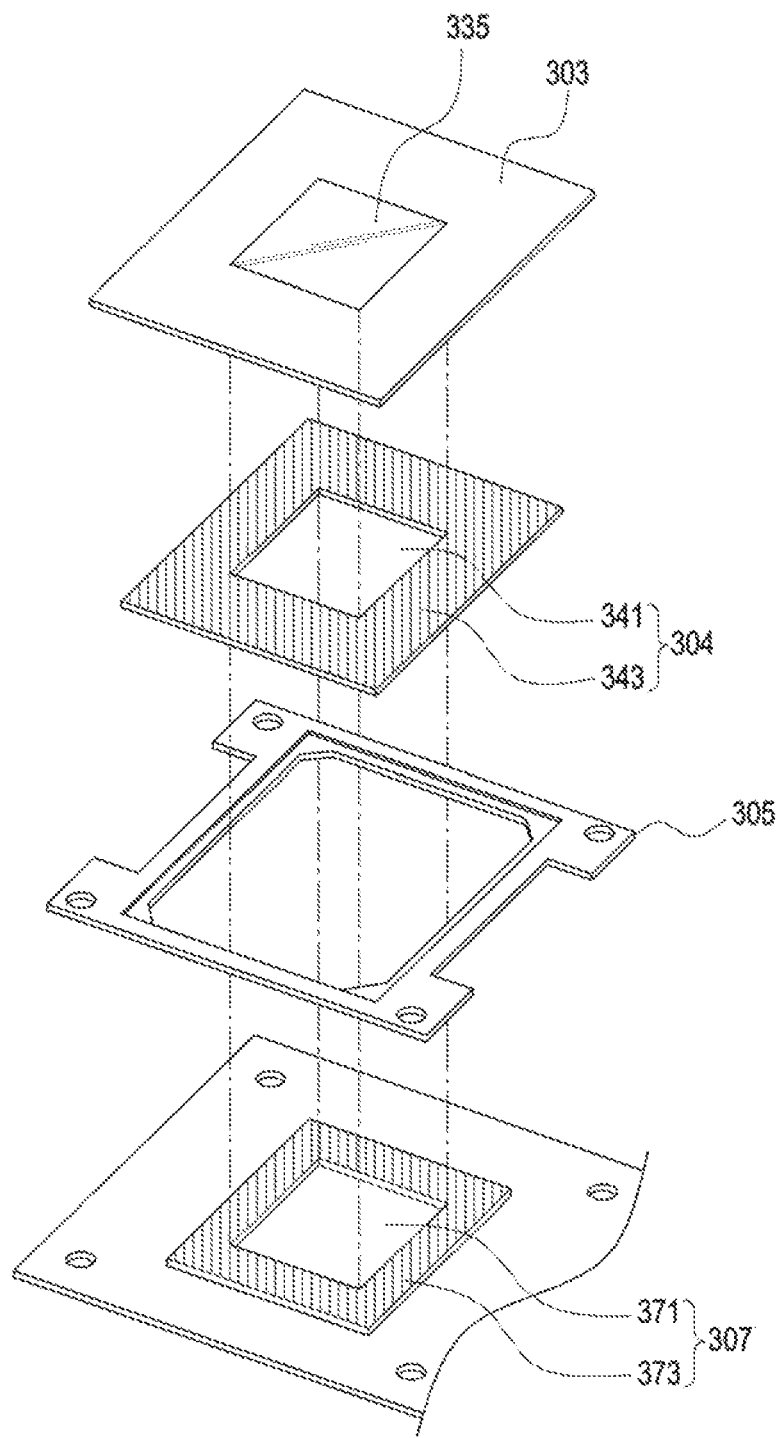
FIG. 8 is an exploded perspective view illustrating a shielding member, an infrared filter, and an image sensor in a camera module according to another of various embodiments of the present disclosure.

FIG. 8 is an exploded perspective view illustrating a shielding member, an infrared filter, and an image sensor in a camera module according to another of various embodiments of the present disclosure.

Referring to FIG. 8, a camera module according to another of various embodiments of the present disclosure may include a support member 305, an image sensor 307 including first and second areas 371 and 373, a board 306, an infrared filter 304 including a light pass area 341 and a masking area 343, a shielding member 303, and a transparent shielding film 335. A description of components identical or similar to their counterparts in the foregoing embodiment will not be provided herein.

The transparent shielding film 335 together with the shielding member 303 may be attached onto one surface of the infrared filter 304. The transparent shielding film 335 may correspond to the light pass area 341 of the infrared filter 304. According to various embodiments of the present disclosure, the transparent shielding film 335 may cover a part of the masking area 343, not limited to corresponding to the light pass area 341.

The transparent shielding film 335 may be formed of resin having transparency and a conductive material that shields electromagnetic waves. The conductive material may be a metal such as silver or aluminum. However, the conductive material may be any of various materials having conductivity, not limited to a metal.

The transparent shielding film 335 may shield electromagnetic waves introduced or emitted along the direction of the optical axis O in the first area of the image sensor 307.

As the camera module 300 according to another of various embodiments of the present disclosure includes the shielding member 303 surrounding the image sensor 307, the transparent shielding film 335, the support member 305, and the conductive member 365, the camera module 300 may shield electromagnetic waves introduced to or emitted from the image sensor 307.

Figure 9:
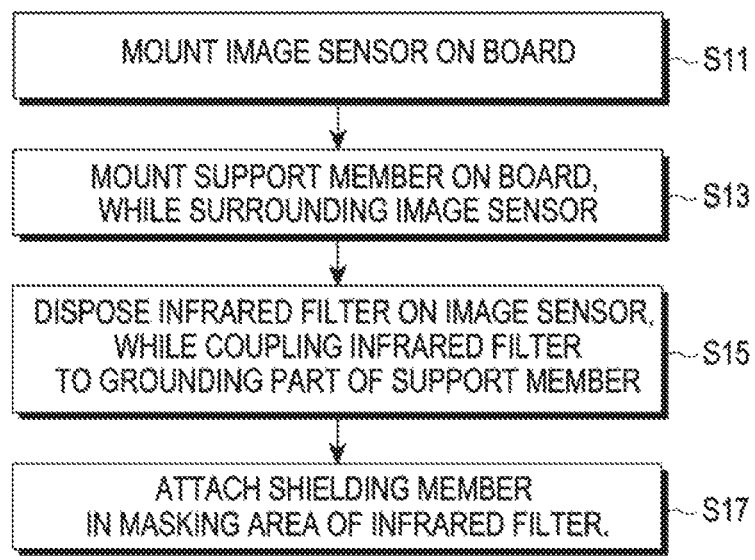
FIG. 9 is a flowchart illustrating a method of fabricating a camera module according to various embodiments of the present disclosure.

FIG. 9 is a flowchart illustrating a method of fabricating a camera module according to various embodiments of the present disclosure.

Referring to FIG. 9, the method of fabricating a camera module according to various embodiments of the present disclosure may include mounting an image sensor on a board in operation S11, mounting a support member on the board, while surrounding the image sensor in operation S13, disposing an infrared filter on the image sensor, while coupling the infrared filter to a grounding part of the support member in operation S15, and attaching a shielding member in a masking area of the infrared filter in operation S17.

According to various embodiments of the present disclosure, the shielding member may be formed by depositing a conductive material in the masking area of the infrared filter in operation S17 of attaching the shielding member in the masking area of the infrared filter. According to various embodiments of the present disclosure, a conductive tape may be attached in the masking area of the infrared filter and used as the shielding member in operation S17 of attaching the shielding member in the masking area of the infrared filter.

According to various embodiments of the present disclosure, the method of fabricating a camera module may further include attaching a transparent shielding film in a light pass area of the infrared filter in operation S19. In operation S19 of attaching the transparent shielding film in the light pass area of the infrared filter, the transparent shielding film may be laminated in the light pass area of the infrared filter by means of a transparent adhesive.

While particular embodiments of the disclosure have been described above, it is apparent to those skilled in the art that many variations can be made without departing from the scope of the disclosure.

What is claimed is:

1. A camera module in an electronic device, comprising:
   an image sensor including a first area configured to receive external light and form an image, and a second area surrounding the first area;
   a board on which the image sensor is mounted;
   a case mounted on one surface of the board and accommodating a lens module therein;
   a shielding member disposed on the image sensor, corresponding to the second area, and configured to shield electromagnetic waves emitted from the image sensor or electromagnetic waves emitted from an electronic part of the electronic device and introduced to the image sensor; and
   an infrared filter including a light pass area corresponding to the first area and a masking area covering the second area;
   a support member accommodated in the case, and supporting the infrared filter and the shielding member, wherein the infrared filter and the shielding member are electrically grounded with the board through the support member; and
   a transparent shielding film together with the shielding member attached onto one surface of the infrared filter, wherein the transparent shielding film is formed of resin having transparency and a conductive material that shields electromagnetic waves,
   wherein the transparent shielding film is provided to shield the electromagnetic waves introduced or emitted along a direction of an optical axis in the first area of the image sensor,
   wherein the light pass area of the infrared filter is disposed between the transparent shielding film and the first area of the image sensor, and the masking area of the infrared filter is disposed between the shielding member and the second area of the image sensor,
   wherein the support member comprises a first ground surface contacting the infrared filter, and a second ground surface contacting the shielding member, and
   wherein the infrared filter is attached to the first ground surface with a first conductive double-sided tape and the shielding member is attached to the second ground surface with a second conductive double-sided tape.

2. The camera module of claim 1, wherein the shielding member is formed of conductive material.

3. The camera module of claim 1, wherein the shielding member is disposed on the image sensor and the lens module.

4. The camera module of claim 1, further comprising:
a plurality of coils provided in the case; and
a carrier configured to move the lens module according to current applied to the plurality of coils.

5. The camera module of claim 4, wherein the shielding member shields electromagnetic waves emitted from the plurality of coils from being introduced to the image sensor, or shields electromagnetic waves emitted from the image sensor from being introduced to the plurality of coils.

6. An electronic device comprising:
a housing; and
a camera module disposed in the housing,
wherein the camera module comprises:
an image sensor including a first area receiving external light and forming an image, and a second area surrounding the first area;
a board on which the image sensor is mounted;
a case mounted on one surface of the board and accommodating a lens module therein;
a shielding member disposed on the image sensor, corresponding to the second area, and configured to shield electromagnetic waves emitted from the image sensor or electromagnetic waves emitted from an electronic part of the electronic device and introduced to the image sensor;
an infrared filter including a light pass area corresponding to the first area and a masking area covering the second area;
a support member accommodated in the case, and supporting the infrared filter and the shielding member, wherein the infrared filter and the shielding member are electrically grounded with the board through the support member; and
a transparent shielding film together with the shielding member attached onto one surface of the infrared filter, wherein the transparent shielding film is formed of resin having transparency and a conductive material that shields electromagnetic waves,
wherein the transparent shielding film is provided to shield the electromagnetic waves introduced or emitted along a direction of an optical axis in the first area of the image sensor,
wherein the light pass area of the infrared filter is disposed between the transparent shielding film and the first area of the image sensor, and the masking area of the infrared filter is disposed between the shielding member and the second area of the image sensor,
wherein the support member comprises a first ground surface contacting the infrared filter, and a second ground surface contacting the shielding member, and
wherein the infrared filter is attached to the first ground surface with a first conductive double-sided tape and the shielding member is attached to the second ground surface with a second conductive double-sided tape.

7. The electronic device of claim 6, further comprising:
a plurality of coils provided in the case; and
a carrier configured to move the lens module according to current applied to the plurality of coils.

* * * * *